US012709800B2

(12) United States Patent
Winkler et al.

(10) Patent No.: US 12,709,800 B2
(45) Date of Patent: Aug. 18, 2026

(54) METHODS AND APPARATUS FOR SOLID SOURCE REFILL

(71) Applicant: ASM IP Holding B.V., Almere (NL)

(72) Inventors: Jereld Lee Winkler, Gilbert, AZ (US); Jacqueline Wrench, Mesa, AZ (US); Paul Ma, Scottsdale, AZ (US); Todd Robert Dunn, Cave Creek, AZ (US); Jonathan Bakke, Phoenix, AZ (US); Eric James Shero, Phoenix, AZ (US); Shuaidi Zhang, Chandler, AZ (US); Shubham Garg, Tempe, AZ (US); YoungChol Byun, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 44 days.

(21) Appl. No.: 18/530,321

(22) Filed: Dec. 6, 2023

(65) Prior Publication Data

US 2024/0191352 A1 Jun. 13, 2024

Related U.S. Application Data

(60) Provisional application No. 63/431,398, filed on Dec. 9, 2022.

(51) Int. Cl.
*C23C 16/448* (2006.01)
*C23C 16/455* (2006.01)

(52) U.S. Cl.
CPC .... *C23C 16/4485* (2013.01); *C23C 16/45561* (2013.01)

(58) Field of Classification Search
CPC .......... C23C 16/4485; C23C 16/45561; C23C 16/448; C23C 16/4481; C23C 16/303; C23C 16/4482; C23C 16/52; C23C 16/4408; C23C 16/45525; C23C 16/4583; C23C 16/45544; C23C 16/455; H01L 21/67017; H01L 21/02205; H01L 21/67109; C30B 25/08; C30B 29/403; C30B 25/14; C30B 25/165; G01F 23/0007; G01F 23/04; B01J 4/008; B67D 7/3263; B67D 7/0238
USPC ............... 118/726, 727; 156/345.29, 345.37; 122/21
See application file for complete search history.

(56) References Cited

U.S. PATENT DOCUMENTS 4,309,214 A 1/1982 Foulard
4,351,861 A 9/1982 Henery
4,621,437 A 11/1986 Grande
5,230,162 A 7/1993 Oyler, Jr.
(Continued)

FOREIGN PATENT DOCUMENTS

CN 112704899 A 4/2021
CN 116018426 A 4/2023
(Continued)

*Primary Examiner* — Rudy Zervigon
(74) *Attorney, Agent, or Firm* — Snell & Wilmer L.L.P.

(57) ABSTRACT

Various embodiments of the present technology may provide a first vessel to contain a slurry of a solid precursor powder and an inert liquid, a second vessel to receive the slurry, evaporate the inert liquid, and sublimate the solid precursor powder a first time to form a vapor, a third vessel to recondense the vapor back into a solid state and sublimate the solid precursor a second time to form a vapor, and a reaction chamber to receive the vapor from the third vessel.

10 Claims, 4 Drawing Sheets

(56) References Cited

Figure 1:
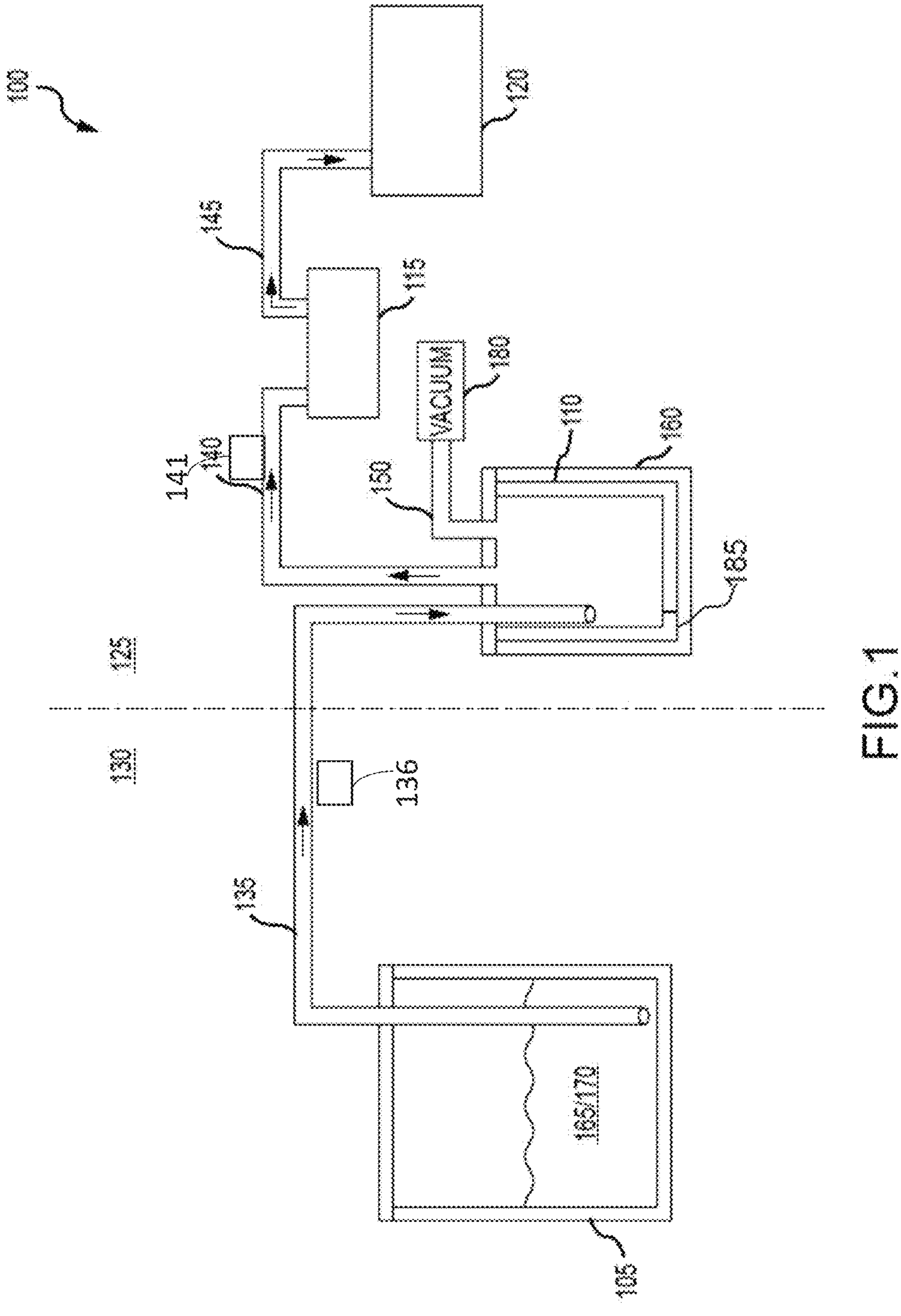

U.S. PATENT DOCUMENTS 5,377,429 A 1/1995 Sandhu
6,136,725 A * 10/2000 Loan ................ C23C 16/45591 438/758
6,174,371 B1 * 1/2001 Iseki ...................... H01L 21/02 156/345.52
6,296,711 B1 * 10/2001 Loan ................ C23C 16/45561 392/399
6,663,716 B2 * 12/2003 Loan .................. C23C 16/4404 118/726
6,984,415 B2 1/2006 McFeely
7,501,007 B2 3/2009 Anderson
7,591,138 B2 9/2009 Ikeuchi
7,775,508 B2 8/2010 Choi
8,012,876 B2 9/2011 Oosterlaken
8,528,225 B2 9/2013 Weisselberg
9,052,138 B2 6/2015 Demarco
9,254,448 B2 2/2016 Turner
9,869,018 B2 1/2018 Lee
9,937,438 B2 4/2018 Stoessel
9,945,611 B2 4/2018 Demarco
11,059,096 B2 7/2021 Strock
11,124,871 B2 9/2021 Adjeroud
11,448,463 B2 9/2022 Ganguly
11,746,413 B2 9/2023 Eldridge
2006/0201425 A1 9/2006 Kobrin
2007/0079760 A1 * 4/2007 Okabe ................ C23C 16/4486 118/726
2007/0108641 A1 * 5/2007 Okabe .............. H01L 21/67109 261/118
2007/0180951 A1 8/2007 Armstrong
2007/0269983 A1 11/2007 Sneh
2008/0245306 A1 * 10/2008 Nakao ................ C23C 16/4486 118/726
2008/0268143 A1 10/2008 Vahlas
2009/0312567 A1 12/2009 Hrnciar
2010/0022097 A1 * 1/2010 Yamoto ............ C23C 16/45544 438/758
2013/0118026 A1 5/2013 Demarco
2014/0072479 A1 3/2014 Chu
2017/0232552 A1 8/2017 Crear
2020/0318900 A1 10/2020 Baxter
2021/0143007 A1 5/2021 Bush
2022/0010425 A1 1/2022 Novozhilov
2022/0042174 A1 2/2022 Woelk
2022/0341037 A1 10/2022 Murakami
2022/0341038 A1 10/2022 Okabe
2023/0151486 A1 5/2023 Komori
2023/0235956 A1 7/2023 David
2023/0311023 A1 10/2023 Komori

FOREIGN PATENT DOCUMENTS

CN 116033962 A 4/2023
EP 3458626 B1 3/2020
JP 5837670 B2 12/2015
KR 970052056 A 7/1997
MX PA99001853 5/2000
WO 2005021807 A2 3/2005
WO 2019023011 A1 1/2019
WO 2020076329 A1 4/2020
WO 2022159571 A1 7/2022
WO 2023280840 A1 1/2023

* cited by examiner

METHODS AND APPARATUS FOR SOLID SOURCE REFILL

CROSS-REFERENCE TO RELATED APPLICATIONS

This application is a nonprovisional of, and claims priority to and the benefit of, U.S. Provisional Patent Application No. 63/431,398, filed Dec. 9, 2022 and entitled "METHODS AND APPARATUS FOR SOLID SOURCE REFILL," which is hereby incorporated by reference herein.

FIELD OF INVENTION

The present disclosure generally relates to an apparatus for semiconductor equipment. More particularly, the present disclosure relates to a system and apparatus for refill of a solid source precursor.

BACKGROUND OF THE TECHNOLOGY

Conventional semiconductor manufacturing systems have a single solid source vessel that delivers chemistry directly to a reaction chamber during wafer processing. The solid source vessel that directly provides the chemistry to the reaction chamber is located proximate to the reaction chamber and may be limited in the volume of solid precursor it can hold. When the precursor in the source vessel is depleted, the solid source vessel must be allowed to cool before it can be removed and replaced with a full vessel. The process of waiting for the vessel to cool and replacing it causes system downtime.

Other systems may provide a remotely-located vessel that supplies chemistry to refill the solid source vessel. However, in this case, the transport lines from the remotely-located vessel to the solid source vessel must be heated, which increases the cost and complexity of the system.

SUMMARY OF THE INVENTION

Various embodiments of the present technology may provide a first vessel to contain a slurry of a solid precursor powder and an inert liquid, a second vessel to receive the slurry, evaporate the inert liquid, and sublimate the solid precursor powder a first time to form a vapor, a third vessel to recondense the vapor back into a solid state and sublimate the solid precursor a second time to form a vapor, and a reaction chamber to receive the vapor from the third vessel.

According to one aspect, an apparatus comprising: a first vessel configured to contain a slurry and maintained at a first temperature, wherein the slurry comprises a solid precursor powder and an inert liquid; a second vessel fluidly connected to the first vessel via a first conduit and configured to: receive the slurry via the first conduit while the second vessel is at a second temperature; and sublimate the slurry at a third temperature that is greater than the second temperature to form a vapor; a vacuum source, connected to the second vessel via a third conduit, configured to evaporate the inert fluid out of the second vessel; a third vessel connected to the second vessel via a second conduit configured to flow the vapor from the second vessel to the third vessel, wherein the third vessel is configured to operate at a fourth temperature and a fifth temperature; and a reactor connected to the third vessel via a third conduit.

In one embodiment of the above apparatus, the first temperature is in a range of 20 to 25 degrees Celsius, and the first conduit is maintained at the first temperature.

In one embodiment of the above apparatus, the second temperature is greater than the first temperature; the fourth temperature is 15-20 degrees Celsius less than the fifth temperature; and the third temperature is 15-20 degrees Celsius less than the fourth temperature.

In one embodiment of the above apparatus, the second and third conduits are heated to the third temperature.

In one embodiment of the above apparatus, the inert liquid may comprise a perfluoropolyether fluid, a halocarbon, carbon tetrachloride, or trichloroethylene.

In one embodiment, the above apparatus further comprises a heating element in direct contact with the second vessel, wherein the heating element operates to increase the second temperature to the third temperature.

In one embodiment of the above apparatus, the third vessel comprises a sublimator.

In one embodiment of the above apparatus, the second vessel, the third vessel, and the reactor are situated at a first location and the first vessel is situated at a second location that is remote from the first location.

In one embodiment, the above apparatus further comprises a cooling element in direct contact with the second vessel, wherein the cooling element operates to decrease the third temperature to the second temperature.

In one embodiment of the above apparatus, the solid precursor powder comprises: a transition metal element and a halide ligand, or a transition metal element and an organic ligand.

According to another aspect, a method for refilling a source vessel, comprises: forming a slurry in a first vessel at a first temperature, the slurry comprising a solid precursor powder and an inert liquid; flowing the slurry from the first vessel to a second vessel via a first conduit when the second vessel is at a second temperature; removing the inert liquid from the solid precursor powder comprising evaporating the inert liquid while leaving the solid precursor powder in the second vessel; forming a first vapor of the solid precursor powder comprising sublimating the solid precursor powder at a third temperature that is greater than the second temperature; flowing the first vapor from the second vessel to a third vessel via a second conduit when the third vessel is a fourth temperature; condensing the first vapor back to the solid precursor powder in the third vessel when the third vessel is at the fourth temperature; forming a second vapor from the solid precursor powder in the third vessel comprising sublimating the solid precursor powder at a fifth temperature; and flowing the second vapor from the third vessel to a reactor via a third conduit.

In one embodiment of the above method, the first temperature is in the range of 20 to 25 degrees Celsius.

In one embodiment of the above apparatus, the second temperature is greater than the first temperature; the fourth temperature is 15-20 degrees Celsius less than the fifth temperature; and the third temperature is 15-20 degrees Celsius less than the fourth temperature.

According to yet another aspect, an apparatus comprises: a first vessel configured to contain a solution and maintained at a first temperature, wherein the solution comprises an inert solvent and a solid precursor; a second vessel fluidly connected to the first vessel via a first conduit and configured to receive the solution through the first conduit; a heating element configured to: heat the second vessel to a second temperature that is greater than the first temperature to form an evaporate of the inert solvent; and sublimate the solid precursor at a third temperature that is greater than the second temperature to form a vapor; a vacuum source coupled to the second vessel and configured to evacuate the evaporate; a third vessel connected to the second vessel via a second conduit configured to flow the evaporate from the second vessel to the third vessel; and a reactor connected to the second vessel via a third conduit.

In one embodiment of the above apparatus, the first temperature is in a range of 20 to 25 degrees C.; and the second temperature is less than the third temperature.

In one embodiment of the above apparatus, the inert solvent comprises one of dichloromethane, chloroform, toluene, or tetrahydrofuran.

In one embodiment, the above apparatus further comprises a cooling element coupled to the third vessel and configured to cool the third vessel to a third temperature that is less than the second temperature.

In yet another embodiment, a method for refilling a source vessel, comprises: forming a solution in a first vessel, the solution comprising a solid precursor powder and an inert solvent; maintaining the first vessel at a first temperature; flowing the solution from the first vessel to a second vessel via a first conduit; within the second vessel, removing the inert solvent from the solid precursor powder comprising heating the solution in the second vessel to a second temperature to evaporate the inert solvent and forming a first vapor of the inert solvent while leaving the solid precursor powder in the second vessel; within the second vessel, sublimating, at a third temperature, the solid precursor powder to form a second vapor of the solid precursor powder in the second vessel; and flowing the vapor from the second vessel to a reactor via a third conduit.

In one embodiment of the above method, first temperature is in a range of 20 to 25 degrees Celsius, the second temperature greater than the first temperature and less than the third temperature.

In one embodiment, the above method further comprises condensing the first vapor back into a liquid in a third vessel.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
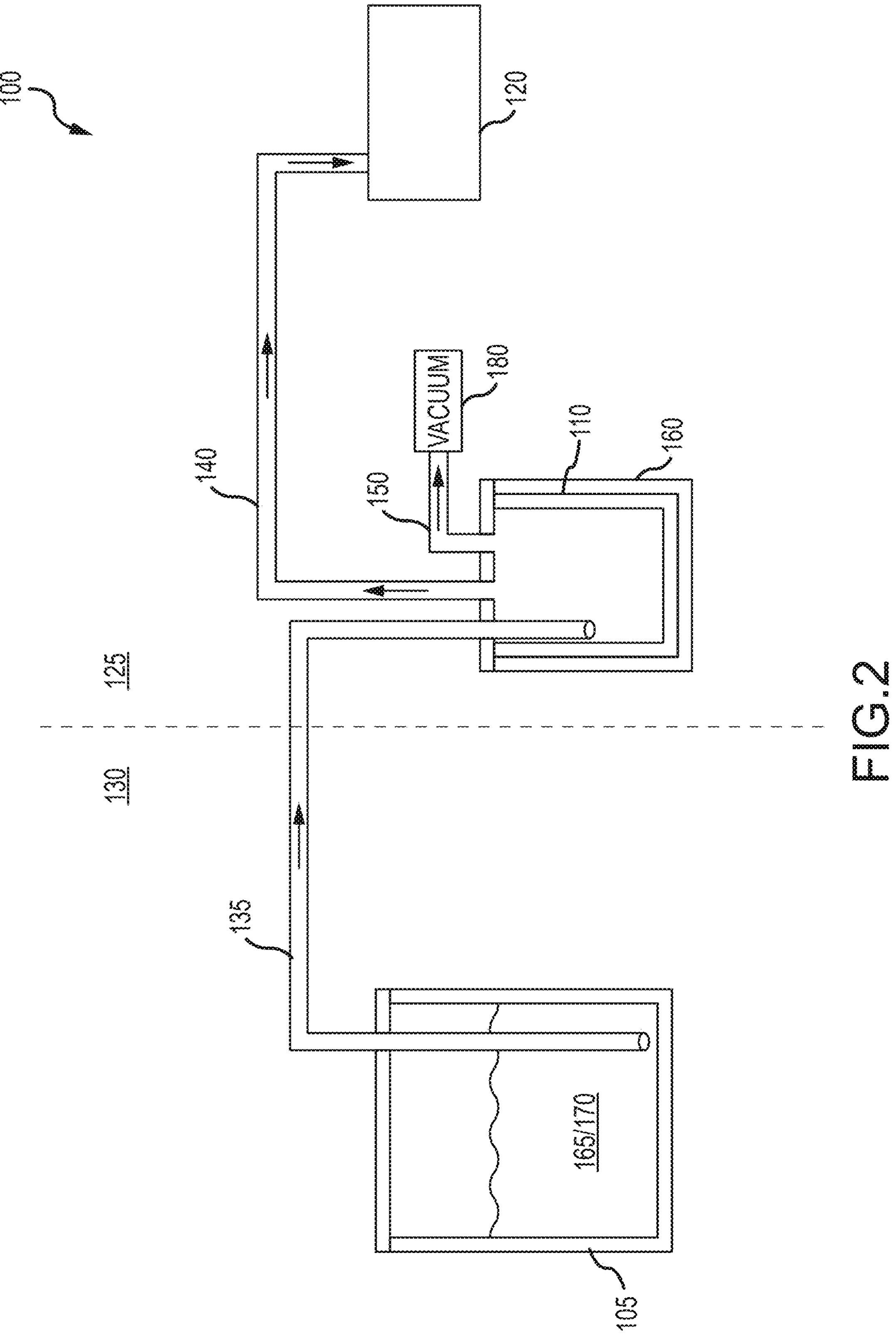
Figure 3:
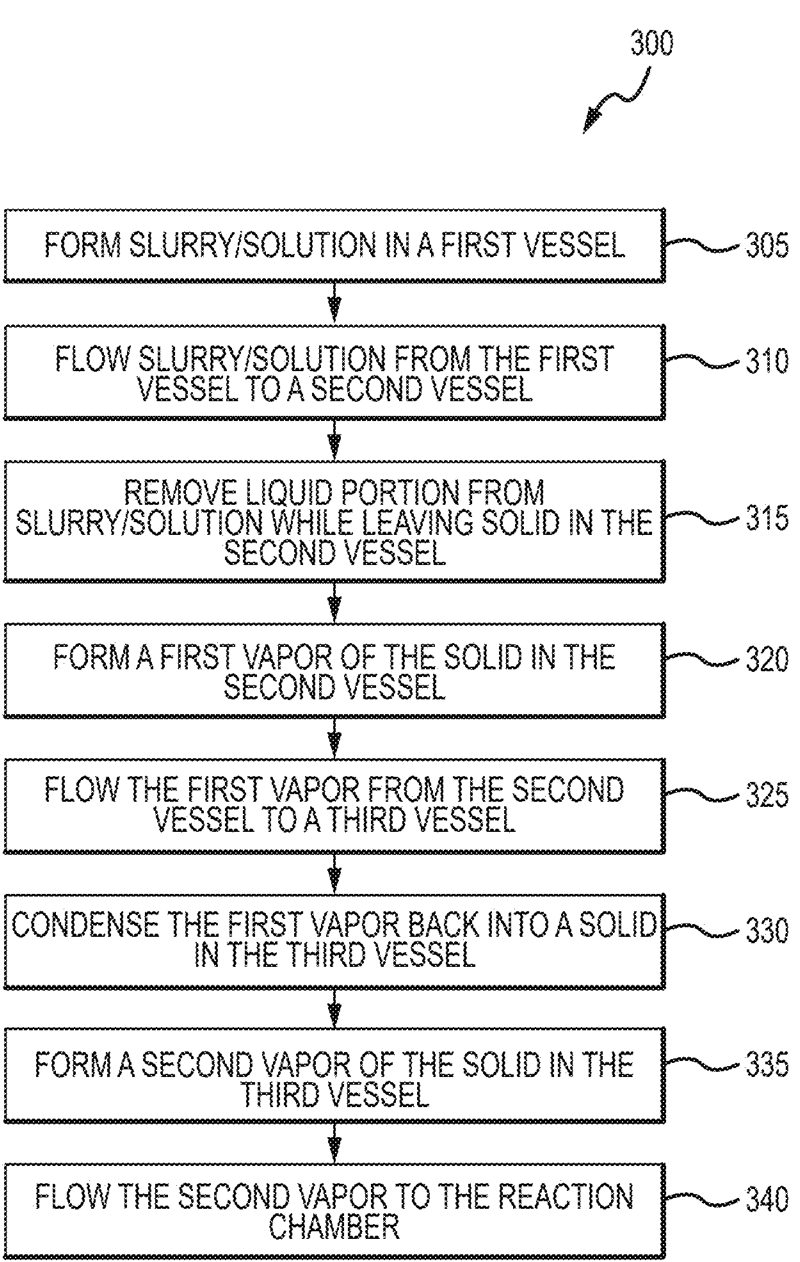
Figure 4:
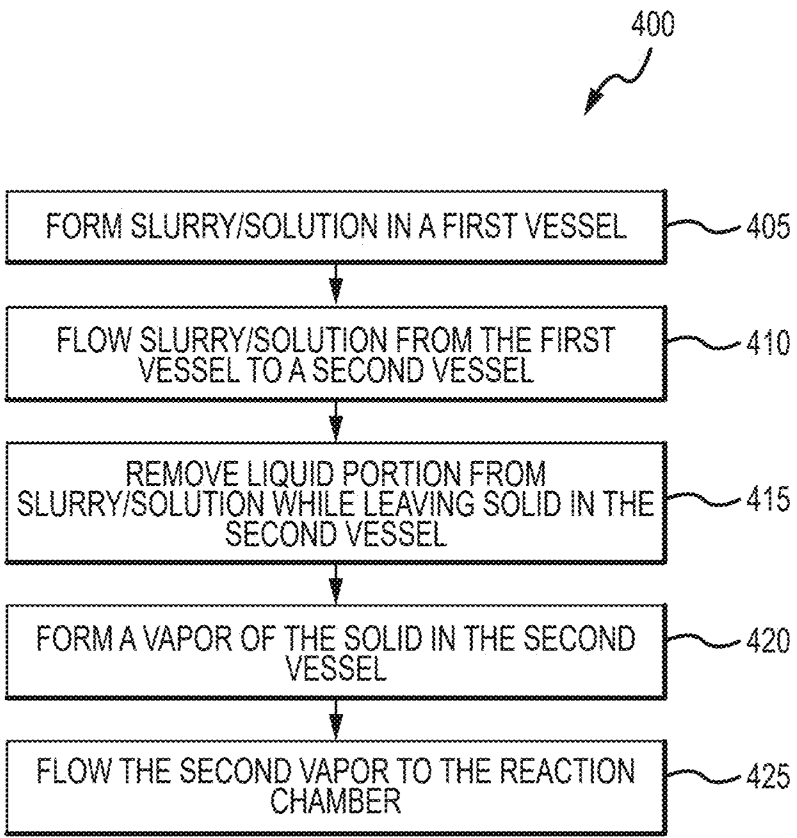

FIG. 1 representatively illustrates a system in accordance with an exemplary embodiment of the present technology;

FIG. 2 representatively illustrates a system in accordance with an alternative embodiment of the present technology;

FIG. 3 is a flow chart for operating the system of FIG. 1 in accordance with an embodiment of the present technology; and FIG. 4 is a flow chart for operating the system of FIG. 2 in accordance with an embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various vessels, reaction chambers, piping, pumps, valves, and heating elements.

Referring to FIG. 1, an exemplary system 100 may comprise a first vessel 105, a second vessel 110, a third vessel 115, and a reaction chamber 120. In the present embodiment, the first vessel 105 may be connected to the second vessel 110 via a first conduit 135. The second vessel 110 may be connected to the third vessel 115 via a second conduit 140. The third vessel 115 may be connected to the reaction chamber 120 via a third conduit 145. In addition, the system 100 may comprise a fourth conduit 150 connected to the second vessel 110.

In an exemplary embodiment, the first vessel 105 may be configured to contain or otherwise hold a slurry 165 comprising a solid precursor and an inert liquid. In various embodiments, the solid precursor may be in the form of a powder. In the case of the slurry 165, the solid precursor is suspended in the inert liquid without changes to the chemical properties of the solid precursor. The inert liquid may comprise a perfluoropolyether fluid, a halocarbon, carbon tetrachloride, or trichloroethylene. The solid precursor may comprise a Group 2, 13, 14, or 15 element and transition metal halides or a Group 2, 13, 14, or 15 element and transition metal metallorganics that are solid at room temperature (e.g., 20-25 degrees Celsius) and with a melting point above 50 degrees Celsius. In an exemplary embodiment, the solid precursor comprises a molybdenum compound, such as a solid molybdenum halide (e.g., $MoCl_2$ or $MoOCl_4$).

Alternatively, the first vessel 105 may be configured to contain or otherwise hold a solution 170 comprising an inert solvent and a solid precursor. In the case of the solution 170, the solid precursor is dissolved in the inert solvent. The inert solvent may comprise dichloromethane, chloroform, toluene, or tetrahydrofuran.

In the present embodiment, the first vessel 105 may be formed from a metal material, such as stainless steel, Hastelloy, aluminum, or the like. The first vessel 105 may be maintained at a first temperature, for example, approximately 20-25 degrees Celsius, such that the slurry 165 or solution 170 is also maintained at the first temperature.

The first conduit 135 may be configured to flow the slurry 165 or solution 170 from the first vessel 105 to the second vessel 110. For example, the system 100 may further comprise pumps, such as first conduit pump 136, valves, and the like along a flow path of the first conduit 135 to achieve a desired flow rate. In addition, the first conduit 135 may be maintained at the first temperature.

The second vessel 110 may be configured to hold or otherwise contain the slurry 165 or solution 170 and may be formed from a metal material, such as stainless steel, Hastelloy, aluminum, or the like. The second vessel 110 may be configured to heat and cool the slurry 165 or solution 170. In some cases, the second vessel 110 may comprise a sublimator. For example, the system 100 may further comprise a heating element 160, such as a heater jacket or a heating apparatus with heating rods disposed embedded within the heating apparatus, in directly contact with an exterior surface of the second vessel 110. Alternatively, the system 100 may comprise a heating element to provide indirect heat to the second vessel 110, for example by convection heating.

The system 100 may further comprise a cooling element 185, such as a thermoelectric cooling module or liquid cooling lines, directly contacting the exterior surface of the second vessel 110. Accordingly, the second vessel 110 and the slurry 165 or solution 170 within the second vessel 110 may vary between a second temperature and a third temperature, wherein the third temperature is greater than the second temperature. In addition, the second and third temperatures are greater than the first temperature. The second vessel 110 may be set to the second temperature when the slurry 165 or the solution 170 is being flowed from the first vessel 105 to the second vessel 110. The second vessel 110 may be set to the third temperature during sublimation.

The second conduit 140 may be configured to flow a vapor from the second vessel 110 to the third vessel 115. For example, the system 100 may further comprise pumps, such as second conduit pump 141, valves, and the like along a flow path of the second conduit 140 to achieve a desired flow rate. In addition, the second conduit 135 may be actively heated and may vary between the second temperature and the third temperature. For example, the second conduit 135 may be heated by any suitable heating elements, such as heater jackets, printed heaters, convection heating, and the like.

In an exemplary embodiment, the fourth conduit 150 may be used to evaporate the inert liquid from the slurry 165 or evaporate the inert solvent from the solution 170. For example, in some cases, the fourth conduit 150 may also be connected to a vacuum source 180.

The third vessel 115 may be configured to condense a vapor back to a solid form and sublimate a solid. Accordingly, the third vessel 115 may vary between a fourth temperature and a fifth temperature. For example, the third vessel 115 may comprise a sublimator. The third vessel 115 may be set to the fourth temperature during condensing and may be set to the fifth temperature during sublimation. The third vessel 115 may be formed from a metal material, such as stainless steel, Hastelloy, aluminum, or the like.

In an exemplary embodiment, the reaction chamber 120 may be configured for processing a substrate, such as a wafer (not shown). The reaction chamber 120 may comprise a susceptor (not shown) to support the wafer, a processing area (not shown) and a showerhead (not shown) positioned above the processing area and susceptor and configured to deliver chemistry to the processing area and wafer.

In the present embodiment, the second temperature is greater than the first temperature, the second temperature is less than the third temperature, the fourth temperature is 15-20 degrees less than the fifth temperature, and the third temperature is 15-20 degrees less than the fourth temperature. In addition, the fifth temperature is a processing temperature that is greater than the first temperature, the second temperature, the third temperature, and the fourth temperature, and the fifth temperature may be based on the particular solid precursor.

In the present embodiment, the second vessel 110, the third vessel 115, and the reaction chamber 120 may be located within a processing area 125, such that the second vessel 110, the third vessel 115, and the reaction chamber 120 are all physically located near each other or enclosed within a particular tool or area (i.e., cleanroom, semiconductor fabrication area). The first vessel 105, however, may be located in a non-processing area 130 that is remotely-located from the processing area 125, such as an area physically below the processing area 125 (i.e., a sub-fab).

In an alternative embodiment, and referring to FIG. 2, the exemplary system 100 may comprise the first vessel 105, the second vessel 110, and the reaction chamber 120. In the present embodiment, the first vessel 105 may be connected to the second vessel 110 via the first conduit 135. The second vessel 110 may be connected to the reaction chamber 120 via the second conduit 140. In addition, the fourth conduit 150 may be connected to the second vessel 110.

In an exemplary embodiment, the first vessel 105 may be configured to contain or otherwise hold the slurry 165 comprising a solid precursor and an inert liquid. In various embodiments, the solid precursor is in the form of a powder. In the case of the slurry 165, the solid precursor is suspended in the inert liquid without changes to the chemical properties of the solid precursor. The inert liquid may comprise a perfluoropolyether fluid, a halocarbon, carbon tetrachloride, or trichloroethylene. The solid precursor may comprise a compound formed from a Group 2, 13, 14, or 15 element or a transition metal element, and a halide ligand (e.g., hafnium chloride. Alternatively, the solid precursor may be formed from a Group 2, 13, 14, or 15 element or transition metal element, and an organic ligand (e.g., trimethyl aluminum). In an exemplary embodiment, the solid precursor comprises a molybdenum compound, such as a solid molybdenum halide (e.g., $MoCl_2$ or $MoOCl_4$).

Alternatively, the first vessel 105 may be configured to contain or otherwise hold a solution 170 comprising an inert solvent and a solid precursor. In the case of the solution 170, the solid precursor is dissolved in the inert solvent. The inert solvent may comprise dichloromethane, chloroform, toluene, or tetrahydrofuran.

In the present embodiment, the first vessel 105 may be formed from a metal material, such as stainless steel, Hastelloy, aluminum, or the like. The first vessel 105 may be maintained at a first temperature, for example, approximately 20-25 degrees Celsius, such that the slurry 165 or solution 170 is also maintained at the first temperature.

The first conduit 135 may be configured to flow the slurry 165 or solution 170 from the first vessel 105 to the second vessel 110. For example, the system 100 may further comprise pumps, valves, and the like along a flow path of the first conduit 135 to achieve a desired flow rate. In addition, the first conduit 135 may be maintained at the first temperature.

The second vessel 110 may be configured to hold or otherwise contain the slurry 165 or solution 170 and may be formed from a metal material, such as stainless steel, Hastelloy, aluminum, or the like. The second vessel 110 may be configured to heat and cool the slurry 165 or solution 170. In some cases, the second vessel 110 may comprise a sublimator. For example, the system 100 may further comprise a heating element 160, such as a heater jacket or a heating apparatus with heating rods disposed embedded within the heating apparatus, in directly contact with an exterior surface of the second vessel 110. Alternatively, the system 100 may comprise a heating element to provide indirect heat to the second vessel 110, for example by convection heating.

The system 100 may further comprise the cooling element, such as a thermoelectric cooling module or liquid cooling lines, directly contacting the exterior surface of the second vessel 110. Accordingly, the second vessel 110 and the slurry 165 or solution 170 within the second vessel 110 may vary between a second temperature and a third temperature, wherein the third temperature is greater than the second temperature. In addition, the second and third temperatures are greater than the first temperature. The second vessel 110 may be set to the second temperature when the slurry 165 or the solution 170 is being flowed from the first vessel 105 to the second vessel 110. The second vessel 110 may be set to the third temperature during sublimation.

In the present embodiment, the second conduit 140 may be configured to flow a vapor from the second vessel 110 to the reaction chamber 120. For example, the system 100 may further comprise pumps, valves, and the like along a flow path of the second conduit 140 to achieve a desired flow rate. In addition, the second conduit 140 may be actively heated and may vary between the second temperature and the third temperature. For example, the second conduit 140 may be heated by any suitable heating elements, such as heater jackets, printed heaters, convection heating, and the like.

In the present embodiment, the fourth conduit 150 may be used to evaporate the inert liquid from the slurry 165 or evaporate the inert solvent from the solution 170. For example, in some cases, the fourth conduit 150 may also be connected to a vacuum source 180.

In an exemplary embodiment, the reaction chamber 120 may be configured for processing a substrate, such as a wafer (not shown). The reaction chamber 120 may comprise a susceptor (not shown) to support the wafer, a processing area (not shown) and a showerhead (not shown) positioned above the processing area and susceptor and configured to deliver chemistry to the processing area and wafer.

In the present embodiment, the second temperature is greater than the first temperature and the second temperature is approximately 15-20 degrees less than the third temperature. In addition, the third temperature is a processing temperature that is greater than the first temperature and the second temperature, and may be based on the particular solid precursor.

In the present embodiment, the second vessel 110 and the reaction chamber 120 may be located within a processing area 125, such that the second vessel 110 and the reaction chamber 120 are all physically located near each other or enclosed within a particular tool or area (i.e., cleanroom, semiconductor fabrication area). The first vessel 105, however, may be located in a non-processing area 130 that is remotely-located from the processing area 125, such as an area physically below the processing area 125 (i.e., a sub-fab).

In an exemplary operation, and referring to FIGS. 1 and 3, a method for solid source refill (300) may comprise forming the slurry 165 or solution 170 in the first vessel 165 (305), and maintaining the first vessel 105 at a first temperature.

The method (300) may further comprise flowing the slurry 165 or the solution 170 from the first vessel 105 to the second vessel 110 (310), for example via the first conduit 135. During step 310, the second vessel 110 is set to a second temperature, for example, by operating the heating element 160. In addition, during step 310, the second temperature is selected to prevent vapor pressure from building in the second vessel 110 (e.g., less than 500 mTorr) and maintain the solid precursor powder in a suspended state. During step 310, the first conduit 135 may be maintained at the first temperature or heated to a temperature that is greater than or equal to the first temperature. For example, the first conduit 135 may be heated to a temperature that is approximately 10-15 degrees greater than the first temperature.

The method (300) may further comprise removing the liquid portion (i.e., the inert liquid or inert solvent) from the slurry 165 or solution 170 while leaving the solid precursor in the second vessel 110 (315). This may be achieved by operating the vacuum source 180 to evaporate the liquid portion of the slurry 165 or solution 170 and/or heating the second vessel 110 and the slurry 165 or solution 170 to a temperature between the second temperature and a third temperature. Alternatively, during step 315, the second vessel 110 may be kept at the second temperature.

The method (300) may further comprise forming a first vapor of the solid precursor in the second vessel 110 (320). This may be achieved by sublimating the solid precursor in the second vessel 110 at the third temperature.

The method (300) may further comprise flowing the first vapor from the second vessel 110 to the third vessel 115 (325), for example via the second conduit 140. During step 325, the second conduit 140 may be heated to a temperature that is equal to or greater than the third temperature. For example, the second conduit 140 may be heated to a temperature that is approximately 10-15 degrees greater than the third temperature. In various embodiments, the second conduit 140 is heated to a temperature that prevents the first vapor from condensing inside of the second conduit 140.

The method (300) may further comprise condensing the first vapor back into a solid precursor in the third vessel 115 (330). This may be achieved by allowing the third vessel 115 to cool (or actively cooling) to a fourth temperature before the vapor is transferred from the second vessel 110 to the third vessel 115. The fourth temperature is less than the third temperature.

The method (300) may further comprise forming a second vapor of the solid precursor in the third vessel 115 (335). This may be achieved by sublimating the solid precursor in the third vessel 115 by heating the solid precursor to a fifth temperature in the third vessel 115.

The method (300) may further comprise flowing the second vapor to the reaction chamber 120 (340), for example via the third conduit 145. During step 340, the third conduit 145 may be heated to a temperature that is greater than or equal to the fifth temperature. For example, the third conduit 145 may be heated to a temperature that is approximately 10-15 degrees greater than the fifth temperature. In various embodiments, the third conduit 145 is heated to a temperature that prevents the second vapor from condensing inside of the third conduit 145. In the present embodiment, the fifth temperature may be greater than or equal to the third temperature.

In an alternative operation, and referring to FIGS. 2 and 4, a method for solid source refill (400) may comprise forming the slurry 165 or solution 170 in the first vessel 165 (405), and maintaining the first vessel 105 at a first temperature.

The method (400) may further comprise flowing the slurry 165 or the solution 170 from the first vessel 105 to the second vessel 110 (410), for example via the first conduit 135. During step 310, the second vessel 110 is set to a second temperature, for example, by operating the heating element 160. In addition, during step 310, the second temperature is selected to prevent vapor pressure from building in the second vessel 110 (e.g., less than 500 mTorr) and maintain the solid precursor powder in a suspended state.

The method (400) may further comprise removing the liquid portion (i.e., the inert liquid or inert solvent) from the slurry 165 or solution 170 while leaving the solid precursor in the second vessel 110 (415). This may be achieved by operating the vacuum source 180 to evaporate the liquid portion of the slurry 165 or solution 170 and/or heating the second vessel 110 and the slurry 165 or solution 170 to a temperature between the second temperature and a third temperature. Alternatively, during step 415, the second vessel 110 may be kept at the second temperature.

The method (400) may further comprise forming a vapor of the solid precursor in the second vessel 110 (420). This may be achieved by sublimating the solid precursor in the second vessel 110 at the third temperature.

The method (400) may further comprise flowing the first vapor from the second vessel 110 to the third vessel 115 (425), for example via the second conduit 140. During step 425, the second conduit 140 may be heated to a temperature that is greater than or equal to the third temperature.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

What is claimed is:

1. An apparatus for refill of a solid source precursor, comprising:

a first vessel configured to contain a liquid slurry, wherein the first vessel comprises a first vessel heating element and is configured to maintain the liquid slurry at a first temperature, wherein the slurry comprises a solid precursor powder and an inert liquid;

a first conduit fluidly connected to the first vessel, wherein the apparatus comprises at least one first conduit pump along a flow path of the first conduit, and wherein the first conduit is configured to flow the liquid slurry through the first conduit;

a second vessel fluidly connected to the first vessel via a first conduit, wherein the second vessel is connected to a sublimator configured to provide heat to the second vessel, and wherein the second vessel is configured to:

receive the liquid slurry via the first conduit while the second vessel is at a second temperature, and wherein the sublimator is configured to:

provide heat to the second vessel to a third temperature greater than the first temperature and the second temperature, wherein the liquid slurry thereby sublimates the solid precursor powder from the liquid slurry at the third temperature that is greater than the first temperature and the second temperature to form a vapor;

a second conduit fluidly connected to the second vessel, wherein the apparatus comprises at least one second conduit pump along a flow path of the second conduit, and wherein the second conduit is configured to flow the vapor;

a vacuum source, connected to the second vessel via a fourth conduit, configured to evaporate the inert fluid out of the second vessel;

a third vessel connected to the second vessel via a second conduit configured to flow the vapor from the second vessel to the third vessel, wherein the third vessel comprises a third vessel heating element and is configured to operate at a fourth temperature and a fifth temperature; and a reactor connected to the third vessel via a third conduit.

2. The apparatus according to claim 1, wherein the first temperature is in a range of 20 to 25 degrees Celsius, and the first conduit comprises a first conduit heating element and is maintained at the first temperature.

3. The apparatus according to claim 1, wherein:

the second temperature is greater than the first temperature;

the fourth temperature is 15-20 degrees Celsius less than the fifth temperature; and the third temperature is 15-20 degrees Celsius less than the fourth temperature.

4. The apparatus according to claim 1, wherein the second conduit comprises a second conduit heating element, wherein the third conduit comprises a third conduit heating element, and wherein the second and third conduits are heated to the third temperature.

5. The apparatus according to claim 1, wherein the first vessel contains a volume of the liquid slurry and wherein the first conduit comprises an inlet pipe extending into the volume of liquid slurry.

6. The apparatus according to claim 1, further comprising a second vessel heating element in direct contact with at least one wall of the second vessel, wherein the second vessel heating element heats the second vessel and a second volume of liquid slurry contained within the second vessel.

7. The apparatus according to claim 1, wherein the third vessel comprises a third vessel sublimator.

8. The apparatus according to claim 1, wherein the first vessel contains a first volume of liquid slurry and the second vessel contains a second volume of liquid slurry.

9. The apparatus according to claim 1, further comprising a cooling element in direct contact with the second vessel, wherein the cooling element operates to decrease the third temperature to the second temperature.

10. The apparatus according to claim 1, wherein the solid precursor powder comprises:

a transition metal element and a halide ligand, or a transition metal element and an organic ligand.

* * * * *